United States Patent
Schwarze et al.

(10) Patent No.: US 10,875,124 B2
(45) Date of Patent: Dec. 29, 2020

(54) METHOD, USE AND APPARATUS FOR PRODUCING A SINGLE-CRYSTALLINE WORK PIECE

(71) Applicant: SLM Solutions Group AG, Lübeck (DE)

(72) Inventors: Dieter Schwarze, Lübeck (DE); Jiachun Chen, Lübeck (DE)

(73) Assignee: SLM Solutions Group AG, Lübeck (DE)

( * ) Notice: Subject to any disclaimer, the term of this patent is extended or adjusted under 35 U.S.C. 154(b) by 52 days.

(21) Appl. No.: 16/348,213

(22) PCT Filed: Oct. 25, 2017

(86) PCT No.: PCT/EP2017/077244
§ 371 (c)(1),
(2) Date: May 8, 2019

(87) PCT Pub. No.: WO2018/086882
PCT Pub. Date: May 17, 2018

(65) Prior Publication Data
US 2019/0321916 A1    Oct. 24, 2019

(30) Foreign Application Priority Data

Nov. 14, 2016 (EP) .................................. 16198682

(51) Int. Cl.
*C30B 13/04* (2006.01)
*B23K 26/342* (2014.01)
(Continued)

(52) U.S. Cl.
CPC ............ *B23K 26/342* (2015.10); *B33Y 10/00* (2014.12); *B33Y 30/00* (2014.12); *B33Y 50/02* (2014.12);
(Continued)

(58) Field of Classification Search
CPC .......... C30B 1/00; C30B 13/005; C30B 13/04
See application file for complete search history.

(56) References Cited

U.S. PATENT DOCUMENTS 5,748,319 A * 5/1998 Baek .................. G01B 11/0683
356/630
5,914,059 A * 6/1999 Marcin, Jr. ............. B23P 6/007
219/121.66
(Continued)

FOREIGN PATENT DOCUMENTS

DE    102016218887    3/2018
EP    2335848    6/2011
(Continued)

OTHER PUBLICATIONS

Nishimoto Ket al: Crystal growth in laser surface melting and cladding of Ni-base single crystal superalloy11 , Welding in the World; Springer, vol. 52, No. 5, May 1, 2008 (May 1, 2008), pp. 64-78, XP001518188, ISSN: 0043-2288 the whole document.
(Continued)

*Primary Examiner* — Robert M Kunemund
(74) *Attorney, Agent, or Firm* — Williams Mullen; Thomas F. Bergert (57) ABSTRACT

A method for producing or repairing a three-dimensional work piece, the method comprising the following steps:
providing at least one substrate (15);
depositing a first layer of a raw material powder onto the substrate (15); and
irradiating selected areas of the deposited raw material powder layer with an electromagnetic or particle radiation beam (22) in a site selective manner in accordance with an irradiation pattern which corresponds to a geometry of at least part of a layer of the three-dimensional work piece to be produced, wherein
the irradiation is controlled so as to produce a metallurgical bond between the substrate (15) and the raw material powder layer deposited thereon. Moreover, a use and apparatus are likewise disclosed.

14 Claims, 2 Drawing Sheets

(51) Int. Cl.
   *B33Y 10/00* (2015.01)
   *B33Y 30/00* (2015.01)
   *B33Y 50/02* (2015.01)
   *C30B 13/08* (2006.01)
   *C30B 13/24* (2006.01)
   *C30B 13/28* (2006.01)
   *C30B 29/52* (2006.01)
   *B33Y 80/00* (2015.01)

(52) U.S. Cl.
   CPC .............. *C30B 13/08* (2013.01); *C30B 13/24* (2013.01); *C30B 13/28* (2013.01); *C30B 29/52* (2013.01); *B33Y 80/00* (2014.12)

(56) References Cited

U.S. PATENT DOCUMENTS

2014/0305368 A1    10/2014  Davis et al.
2016/0158889 A1*    6/2016  Carter .................... G02B 6/425
                                                          219/76.12

FOREIGN PATENT DOCUMENTS

| | | |
|---|---|---|
| EP | 2848335 | 3/2015 |
| JP | 2015189618 A | 11/2015 |
| WO | 2010027317 | 3/2010 |
| WO | 2014131444 | 9/2014 |

OTHER PUBLICATIONS

J. D. Hunt: Steady State Columnar and Equiaxed Growth of Dendrites and Eutectic Materials Science and Engineering, Department of Metallurgy and the Science of Materials, University of Oxford, Parks Road, Oxford OXJ 3PH (Gt. Britain) 65 (1984) 75-83,S.
International Search Report and Written Opinion for PCT/EP2017/077244, European Patent Office, dated Jan. 16, 2018.
European Search Report and Opinion, EP Application No. 16198682.3, European Patent Office, dated May 23, 2017.
International Preliminary Report on Patentability for PCT/EP2017/077244, European Patent Office; dated Oct. 25, 2017.
Examination Search Report for Canadian Patent Application No. 3,042,143, Canadian Patent Office, dated May 29, 2020.
Office Action for Japanese Patent Application No. 2019-524966, Japanese Patent Office, dated Jul. 29, 2020.

* cited by examiner

METHOD, USE AND APPARATUS FOR PRODUCING A SINGLE-CRYSTALLINE WORK PIECE

CROSS-REFERENCE TO RELATED APPLICATIONS

This application is the U.S. national phase of international application PCT/EP2017/077244, filed on Oct. 25, 2017, which claims the benefit of European Patent Application No. 16198682.3 filed on Nov. 14, 2016; all of which are hereby incorporated herein in their entirety by reference.

The present invention relates to a method, use and apparatus for producing a single-crystalline work piece by irradiating layers of a raw material powder with electromagnetic or particle radiation.

Powder bed fusion is an additive layering process by which pulverulent, in particular metallic and/or ceramic raw materials can be processed to three-dimensional work pieces of complex shapes. To that end, a raw material powder layer is applied onto a carrier and subjected to laser radiation in a site selective manner in dependence on the desired geometry of the work piece that is to be produced. The laser radiation penetrating into the powder layer causes heating and consequently melting or sintering of the raw material powder particles. Further raw material powder layers are then applied successively to the layer on the carrier that has already been subjected to laser treatment, until the work piece has the desired shape and size. Powder bed fusion may be employed for the production of prototypes, tools, replacement parts, high value components or medical prostheses, such as, for example, dental or orthopaedic prostheses, on the basis of CAD data.

The thermal and mechanical properties of metallic work pieces typically strongly depend on the microstructure of the work pieces. For example, single crystalline metallic materials, in particular stainless steels or Ni, Co or Fe based superalloys, exhibit excellent mechanical, chemical and thermal properties even at elevated temperatures. These materials are therefore commonly used for manufacturing components subjected to high mechanical and thermal loads such as, for example, turbine blades or engine parts.

WO 2014/131444 A1 discloses an apparatus for producing three-dimensional work pieces which comprises a carrier, a powder application device for applying a raw material powder onto the carrier, an irradiation device for selectively irradiating electromagnetic or particle radiation onto the raw material powder applied onto the carrier, and a control unit which controls the operation of the powder application device and the irradiation device in dependence on the crystallization behavior of the raw material powder, in order to tailor the microstructure of a work piece made of said raw material powder by an additive layer construction method. In particular, the control unit controls a radiation source and/or an optical unit of the irradiation device so as to adjust a beam size, a beam profile, a scan speed and/or a scan pattern of a radiation beam irradiated onto the raw material powder applied onto the carrier or an output of the radiation source in dependence on the crystallization behavior of the raw material powder, in order to tailor the microstructure of the work piece. Thereby, a work piece having a substantially single crystalline or directionally/dendritically solidified microstructure may be obtained.

The invention is directed at the object of providing a solution which allows the generation of a high-quality single-crystalline three-dimensional work pieces by irradiating layers of a raw material powder with electromagnetic or particle radiation.

This object is addressed by a method as defined in claim 1, a use according to claim 14 and an apparatus according to claim 15.

A method for producing or repairing a three-dimensional work piece is proposed, the method comprising the step of providing at least one substrate. The substrate may cover at least part of a build area, on which the work piece is to be produced. The build area may be defined by and/or correspond to a surface of a carrier on which the substrate may be arranged in order to deposit raw material powder thereon.

Accordingly, the build area may correspond to a maximum cross sectional area or a footprint of a work piece that can be produced or repaired.

The substrate may further be arranged on a carrier of an apparatus used for carrying out the method. Said carrier may be a rigidly fixed carrier. Preferably, however, the carrier is designed to be displaceable in vertical direction so that, with increasing construction height of a work piece, as it is built up in layers from the raw material powder, the carrier can be moved downwards in the vertical direction.

As, detailed below, the substrate may thus be provided in the form of a thin planar member. Also, the substrate may have been produced differently from an additive layer manufacturing process and, in particular, from a selective laser melting process. On the other hand, the substrate may be provided in form of a work piece that needs to be repaired, for example, by at least partially restoring some of its work piece layers. In this case, the substrate may have very well been produced by an additive layer manufacturing process and, in particular, a selective laser melting process.

As a general remark, producing or generating a work piece may relate to fully producing a solidified work piece from raw material powder, whereas repairing a work piece may relate to only restoring selected regions of an already solidified work piece which has been damaged.

As further detailed below, the substrate may be a substantially single-crystalline substrate. The term "substantially single crystalline", in the context of the present application, may relate to a microstructure of the substrate which is in fact single crystalline, i.e. does not comprise any grain boundaries. Yet, the expression "substantially single crystalline" should also cover a microstructure which does have grain boundaries between grains having preferred orientation, i.e. a microstructure wherein the grain boundaries extend substantially parallel to each other in a preferred direction. Such a microstructure typically is obtained by a directional solidification of metallic melts.

The method further comprises a step of depositing a first layer of a raw material powder onto the substrate. The raw material powder preferably is a metallic powder, in particular a metal alloy powder, but may also be a ceramic powder or a powder containing different materials. In general, the material of the substrate and the material of the raw material powder may be the same or at least belong to the same class (i.e, metallic or ceramic).

The powder may have any suitable particle size or particle size distribution. It is, however, preferable to process powders of particle sizes <100 µm. The deposition may be achieved by using a powder application device as further detailed below. The deposited raw material powder layer may cover a surface of the substrate by at least ca. 50%, by at least ca. 75% or by ca. 100%. The raw material powder layer may be used to produce a substantially complete cross-sectional area of the work piece therefrom. On the other hand, for example in case of repairing, the layer may be used to produce (or, in other words, restore) only part of a cross-sectional area of the work piece, e.g. by filling a gap or hole in a respective work piece layer.

The method further comprises a step of irradiating selected areas of the deposited raw material powder layer with an electromagnetic or particle radiation beam in a site selective manner in accordance with an irradiation pattern which corresponds to a geometry of at least part of a layer of the three-dimensional work piece. Hence, the raw material powder applied onto the carrier may be subjected to electromagnetic or particle radiation in a site-selective manner in dependence on the desired geometry of the work piece that is to be produced or repaired. The irradiation is preferably adapted to cause a site-selective melting of the raw material powder particles (i.e., performing a selective laser melting process).

The irradiation may be achieved by means of an irradiation device. The irradiation device may comprise at least one radiation source, in particular a laser source, and at least one optical unit for guiding and/or processing a radiation beam emitted by the radiation source. The radiation source may comprise a diode pumped Ytterbium fibre laser emitting laser light at a wavelength of approximately 1070 to 1080 nm. The optical unit may comprise optical elements such an object lens, in particular and f-theta lens, and a scanner unit, the scanner unit preferably comprising a diffractive optical element and a deflection mirror. For example, the irradiation device may be an irradiation device as described in EP 2 335 848 A1. For guiding the radiation beam, the optical unit may comprise an optical scanner unit, which is preferably movable about at least two axes. The irradiation device may also comprise a plurality of radiation sources, such as single laser diodes, which are arranged in form of an array or matrix. These may jointly be controlled to produce dedicated radiation patterns on the deposited raw material powder. Reference is made to a corresponding solution known from DE 10 2016 218 887 (not yet published at the application date of the present disclosure).

In case of producing a three-dimensional work piece, the irradiation pattern preferably corresponds to a complete cross-sectional layer of the three-dimensional work piece to be produced. In case of repair, only a part or a segment of a respective work piece layer may be covered by a respective irradiation pattern.

The irradiation is controlled so as to produce a metallurgical bond between the (preferably single-crystalline) substrate and the raw material powder layer deposited thereon. The metallurgical bond may result from melting part of the raw material powder layer as well as at least the surface and especially a thin surface layer of the substrate on which the raw material powder is deposited. For example, a surface layer of the substrate may be melted, said layer having a thickness of less than ca. 0.5 mm or less than 0.05 mm. Thereby, a common melt pool may be formed between the substrate and raw material powder. Said melt pool may then solidify to form the metallurgical bond, preferably, under formation of the desired single-crystalline microstructure. For producing the metallurgical bond, the irradiation may be controlled so as to achieve a desired melting behaviour, such a melting depth or melting volume. Suitable values can be determined by way of simulations or experiments, for example, in dependence of the used materials, the layer or substrate thickness and the like.

The inventor has discovered that due to using a (preferably single-crystalline) substrate that is bonded with the raw material powder layer, a single-crystalline growth of dendrites of the melted powder material may be achieved. In particular, an epitaxial growth along the orientation of the crystalline structure of the substrate may be achieved. Hence, a single-crystalline microstructure of the produced work piece layer can more reliably be achieved.

According to a further embodiment, after completing irradiation of the first raw material powder layer, multiple sequences of depositing and irradiating subsequent raw material powder layers may be performed, to successively build up the work piece along a build axis. To put it differently, a sequence of depositing raw material powder layers and irradiating them may be repeated, so as to produce or repair the work piece according to an additive layering process, such as selective laser melting. As is well known, this may include always depositing a new uppermost raw material powder layer on top of a most recently irradiated one, to then irradiate said uppermost raw material powder layer in order to generate a corresponding work piece layer or work piece layer segment therefrom. The work piece may thus comprise and be built up of a respective sequence of work piece layers.

The build axis may correspond to a substantially vertical spatial direction (commonly referred to as Z-axis). Likewise, the build axis may extend substantially perpendicularly to the build area, the substrate and/or an area defined by the raw material powder layers.

Unless indicated to the contrary, discussions on forming, processing and/or irradiating a raw material powder layer may, according to the present disclosure, apply to at least half or even each of a respective sequence of raw material powder layers. In particular, such discussions may relate to at least ca. 50%, at least ca. 75% or ca. 100% of the total number of raw material powder layers used for producing or repairing a work piece. For example, the following examples of choosing irradiation parameters may apply to at least half of or even to each of a sequence of raw material powder layers used for producing or repairing a work piece.

The method may further comprise the step of adjusting the crystal orientation of the (preferably single-crystalline) substrate so as to substantially correspond to the build axis. Accordingly, the crystal orientation of said substrate may also extend substantially vertically in space and/or along a respective Z-axis. Overall, as a result of irradiating the raw material powder, this may promote a crystal growth taking place along the build axis in order to produce a respectively oriented single-crystalline work piece layer.

Additionally or alternatively, the method may comprise the step of adjusting a crystal orientation of the (preferably single-crystalline) substrate and a grain growth direction in the layer of the three-dimensional work occurring upon irradiating said layer so as to correspond to one another. This may be achieved by adjusting a position and/or orientation of the substrate prior to depositing and irradiating raw material powder thereon. In this context, selecting the substrate's position and/or orientation may be subject to an expected or predetermined grain growth direction, which may be influenced by selecting suitable irradiation parameters. Alternatively, the grain growth direction may be controlled depending on a known crystal orientation of the (preferably single-crystalline) substrate. Again, this may be achieved by selecting suitable irradiation parameters. Of course, both of the substrate's crystal orientation as well as the grain growth direction may substantially correspond to a build axis of the work piece.

According to a further aspect, at least one of the following parameters is used for controlling the irradiation:

a beam size, a defocusing state and/or a beam profile of the electromagnetic or particle radiation beam, an exposure time of the selected areas of a deposited raw material powder to the electromagnetic or particle radiation beam, the irradiation pattern, a speed of moving an irradiation site across a deposited raw material powder layer, a remelting rate along the build axis and/or within the plane of a presently irradiated raw material powder layer, and an energy input of the electromagnetic or particle radiation beam into the selected areas of the raw material powder layer applied onto the substrate.

Using the above parameters for controlling the irradiation may include setting them to suitable values and/or varying them appropriately before, during or after irradiation.

The beam size may relate to a diameter or area of the beam, in particular with respect to a cross-sectional area thereof when impinging or impacting the raw material powder layer. In general, said diameter or area may be increased under the control of the control unit in order to promote the occurrence of a low solidification or crystal growth velocity in combination with a high temperature gradient in the melt produced by irradiating the powder and to thus obtain a substantially single crystalline microstructure in the generated work piece layer. In general, according to the present disclosure, a high temperature gradient may be set in the melt with regard to the build axis. Specifically, such a temperature gradient may be set in a negative direction along the build axis (e.g. a negative Z-direction).

Preferably, the beam diameter of a radiation beam emitted by a radiation source and processed by an optical unit may be set to ≥100 µm, in particular ≥500 µm and specifically ≥750 µm in order to obtain a substantially single crystalline or directionally/dendritically solidified microstructure in the generated work piece.

The defocusing state may relate to a deliberate deviation from an ideal focusing state of the radiation beam, e.g. by adjusting a focus position of said beam to be at a distance to an upper surface of the raw material powder layer that should be irradiated. As is generally known, the radiation beam may thus impinge or impact the raw material powder layer in an out-of-focus-state to, for example, limit the energy input into the raw material powder.

The beam profile may generally relate to an intensity profile or intensity distribution of the radiation beam, e.g. transversely across its cross-section. Accordingly, it may include an as such known top-hat-intensity profile, Gaussian or ring-shaped donut profile.

A suitable selection of beam parameters may include choosing a top-hat beam profile with an increased beam diameter or a deliberately defocused low-diameter beam having a Gaussian profile.

The exposure time to the radiation beam may be selected so as to achieve a desired energy input and/or melting process of the raw material powder and/or the (preferably single crystalline) substrate.

The irradiation pattern may include the shape or geometry of the total area which is irradiated and/or a strategy for moving an irradiation site within said area so as to cover the surface to be irradiated (e.g. by moving it along dedicated vectors extending across said surface). Such movements may be achieved by scanning a radiation beam across the raw material powder along so-called scan or hatch vectors. Likewise, in case of using an array or matrix of e.g. laser-LED radiation sources, this may include activating adjacent radiation sources in a coordinated manner so as to subsequently irradiate dedicated spots on said raw material powder. The irradiated spots may be arranged along dedicated scan or hatch vectors, so that if being subsequently activated, movement of an irradiation site across the raw material powder along said vectors may be reproduced.

The speed of moving an irradiation site across a deposited raw material powder layer may relate to any of the above discussed movements achieved by scanning a radiation beam or by a coordinated activation of a plurality of radiation sources.

The remelting rate along the build axis may relate to a rate of remelting previously irradiated raw material powder layers (and/or the preferably single crystalline substrate) when irradiating a most recently deposited raw material powder layer. In other words, a melting depth may be concerned, which may include remelting already produced work piece layers below of a most recently deposited and thus uppermost raw material powder layer. Accordingly, the remelting rate may be selected so as to set a remelting depth and thus an overall melt pool depth along the build axis to a desired value.

Similarly, the remelting rate within the plane of a presently irradiated raw material powder layer may relate to remelting segments of the raw material powder layer which have previously already been irradiated. Such a previous irradiation may be caused by moving an irradiation site across the raw material powder layers, for example, along dedicated scan or hatch vectors. In this context, the remelting may result from the radiation beam diameters overlapping each other when being moved along adjacent vectors. More precisely, the melt pools that are produced as a result of moving a radiation beam along adjacent scan or hatch vectors may overlap each other within the plane of a presently irradiated raw material powder layer. In this context, a melt pool produced during a run along a first vector may have at least partially solidified again during a run along an adjacent second vector. Yet, due to the overlapping beam diameters, said melt pool may at least partially be remelted again during the run along the adjacent second vector.

The energy input may further be selected so as to determine a desired melting speed, temperature distribution, solidification speed or other melting-related characteristics, so as to control the resulting microstructure of the produced work piece layer.

According to a further aspect, the at least one parameter for controlling the irradiation is substantially constant between at least some of the subsequent raw material powder layers. To put it differently, the irradiation conditions may be maintained substantially constant at least for some of the subsequently deposited raw material powder layers out of which a sequence of work piece layers is produced. Of course, this may also include keeping more than one irradiation parameter constant. As previously indicated, this may relate to at least ca. 50%, ca 75% or even ca. 100% of the subsequent raw material powder layers. By maintaining constant irradiation parameters, a constant single crystalline growth in the melted materials can more reliably be achieved.

The irradiation may further be controlled in dependence on the crystallization behavior of the raw material powder in such a manner that single-crystalline layers of the three-dimensional work piece are produced. Accordingly, the method may be used for manufacturing or repairing work pieces having a desired microstructure and, in particular, a single-crystalline microstructure. By tailoring the microstructure of the work piece accordingly, work pieces having specific mechanical, thermal, electrical or chemical properties may be manufactured. For example, work pieces exhibiting a high mechanical, chemical and thermal resistance, in particular at elevated temperatures, may be obtained.

In general, the crystallization behavior of a melt, in particular a metallic melt, may be described, for example, by the so-called v-G-diagram, wherein the solidification or crystal growth velocity v is plotted against the temperature gradient G, typically on a double logarithmic scale. A v-G-diagram may be measured or calculated for any desired material, as it is well known in the art and described, for example, in the publication by J. D. Hunt entitled "Steady State Columnar and Equiaxed Growth of Dendrites and Eutectic", Materials Science and Engineering, Vol. 65, 1984, pages 75-83. Within the v-G-diagram, different regions of v-G-combinations are associated with different microstructural properties of the solidified melt. For example, high solidification or crystal growth velocities and low temperature gradients lead to the development of a polycrystalline globulitic microstructure, whereas low solidification or crystal growth velocities in combination with (local) undercooling of the melt due to high temperature gradients result in the formation of dendrites and single crystals Again, in the context of the present disclosure said temperature gradient may generally be produced along the build axis and, in particular, along a negative direction of said build axis (e.g. a negative Z-direction).

The irradiation according to the present method may thus be controlled in such a manner that, in dependence on the raw material powder type, a suitable combination of the solidification or crystal growth velocity and the temperature gradient occurring in the melt produced by irradiating the powder with electromagnetic or particle radiation is obtained in order to generate the desired microstructure, e.g. a directionally solidified microstructure comprising substantially dendrites and/or single crystals. In particular, this may include generating a grain growth direction in the layer of the three-dimensional work piece which corresponds to a crystal orientation of the (preferably single-crystalline) substrate (e.g. by being oriented along the build axis).

For doing so, any of the above irradiation parameters and/or operating parameters of a radiation source or of a respective plurality of radiation sources as well as parameters of a possible optical unit may be selected in dependence on the crystallization behavior of the raw material powder, in order to tailor the microstructure of a work piece made of said raw material powder by an additive layer construction method. In other words, the operation of the radiation source(s) and/or the optical unit(s) may be controlled in such a manner that, in dependence on the raw material powder and/or substrate type, a suitable combination of the solidification or crystal growth velocity and the temperature gradient occurring in the melt produced by irradiating the powder with electromagnetic or particle radiation is obtained in order to generate the desired microstructure (preferably single crystalline).

For example, the speed of moving (i.e., scanning) irradiation sites across the raw material powder layers may be decreased in order to promote the occurrence of a low solidification or crystal growth velocity in combination with a high temperature gradient in the melt produced by irradiating the powder. This may help to obtain a substantially single crystalline or directionally/dendritically solidified microstructure in the generated work piece. Preferably, said speed may be set to less than 1 m/s.

Additionally or alternatively thereto, it is conceivable to promote the occurrence of a low solidification or crystal growth velocity in combination with a high temperature gradient in the melt and thus the formation of a substantially single crystalline microstructure by setting the distance between hatches along which the irradiation sites are arranged to a suitable value. In other words, the hatch distance may be used as a parameter for controlling the resulting microstructure in a desired manner. Preferably, the hatch distance may be set to a value that is smaller than a diameter of the applied radiation beam and/or to less than 1 mm.

Finally, an output of the radiation source, in particular a laser power of a laser source, may be controlled in such a manner that, in dependence on the raw material powder type, a suitable combination of the solidification or crystal growth velocity and the temperature gradient occurring in the melt produced by irradiating the powder is obtained in order to generate the desired single crystalline microstructure, Specifically, the output of the radiation source may be increased in order to promote the occurrence of a low solidification or crystal growth velocity in combination with a high temperature gradient in the melt and thus the formation of a substantially single crystalline microstructure in the generated work piece. Preferably, the output of the radiation source may be set to a value larger than ca. 100 W, larger than ca. 500 W, larger than ca. 1000 W or larger than ca. 2000 W.

Moreover, the deposition of a raw material powder layer may be controlled in such a manner that, in dependence on the raw material powder type, a suitable combination of the solidification or crystal growth velocity and the temperature gradient occurring in the melt produced by irradiating the powder with electromagnetic or particle radiation is obtained in order to generate the desired microstructure. In particular, the deposition of a raw material powder layer may be controlled so as to adjust a thickness of a deposited raw material powder layer in dependence on the crystallization behavior of the raw material powder, in order to tailor the (preferably single crystalline) microstructure of a work piece made of said raw material powder by an additive layer construction method.

For example, the thickness of the deposited raw material powder layer may be increased, if it is desired to promote the occurrence of a low solidification or crystal growth velocity in combination with a high temperature gradient in the melt and thus the formation of a substantially single crystalline or directionally/dendritically solidified microstructure in the generated work piece. Preferably, the thickness of the raw material powder layer applied onto the carrier may be set to range from 30 to 250 μm.

Overall, the melting point, the melting properties (for example the absence or presence of eutectic compositions in an alloy), the crystallographic structure, and further material properties of the material employed in pulverous form as the raw material for generating a work piece strongly influence the v-G-diagram and hence the combination of the solidification or crystal growth velocity and the temperature gradient occurring in the melt produced by irradiating the powder which is suitable to obtain a desired microstructure in the work piece, such as a single crystalline structure. Consequently, the actual irradiation parameters, the material deposition parameters (e.g. a thickness of raw material powder layers) and/or a possible preheating of the raw material powder layer that have to be adjusted in order to generate the desired microstructure in the work piece may vary significantly in dependence on the raw material powder type.

For example, it is easily conceivable that the irradiation, preheating or material deposition parameters of the device, the powder application device and the heating device which have to be set by means of the control unit in order to generate a substantially single crystalline or directionally/dendritically solidified microstructure in a work piece made of an Aluminum alloy significantly differ from the parameters which have to be set in order to generate a substantially single crystalline or directionally/dendritically solidified microstructure in a work piece made of steel or an Ni, Co or Fe based superalloy. Suitable value ranges, however, may be obtained, based on the teaching of this application by experimental work as it is common to be carried out by a person skilled in art.

According to the present invention, the irradiation can be controlled so that a remelting rate along the build axis Rz fulfils the following condition: Rz>0.3, with Rz=((D−lz)/D), lz being the layer thickness of the presently irradiated raw material powder layer and D being a melt pool depth occurring as a result of the irradiation. As previously discussed, the remelting rate may relate to at least partially melting an already produced work piece layer (and/or the preferably single crystalline substrate), on top of which a most recently and thus uppermost raw material powder layer has been deposited. The layer thickness lz of the deposited raw material powder layers may be uniform throughout the complete production or repairing process. The melt pool depth D may relate to a depth measured along the build axis and/or concern the depth of molten material formed by irradiating the raw material powder.

Additionally or alternatively, the irradiation can be controlled so that a remelting rate within the plane of a presently irradiated raw material powder layer Rx fulfils the following condition: Rx>0.3, with Rx=((W−dy)/W), W being a melt pool width and dy being a distance between adjacent irradiation sites of the raw material powder layer. The melt pool width W may be measured within the plane of the presently irradiated raw material powder layer and, for example, extend substantially perpendicularly to the melt pool depth D. The distance dy may relate to or be defined by adjacent vectors along which respective irradiation sites are arranged, said vectors forming scan or hatch vectors as previously discussed. Accordingly, material that has been molten and solidified by a movement along a first vector may be at least partially re-molten by a movement along a preferably directly adjacent second vector.

The inventor has discovered that if fulfilling any of the above conditions with regard to the remelting rates, a single crystalline microstructure of the generated work piece can more reliably be achieved.

According to a further example, the substrate fulfils at least one of the following conditions:
- the substrate covers at least ca. 0.1%, at least ca. 10%, at least ca. 25%, at least ca. 50%, at least ca. 75% or ca. 100% of a build area that is available for producing or repairing the work piece;
- the substrate is configured as a substantially planar member and, for example, defines a substantially rectangular plane;
- a thickness of the substrate along the build axis is not more than ca. 1000 mm, not more than ca. 200 mm, not more than ca. 100 mm, not more than ca. 50 mm or not more than ca. 10 mm,
- the substrate is a single crystal work piece which, for example, needs to be repaired.

If providing the substrate as a planar member, the plane defined thereby may be arrangeable so as to extend substantially in parallel to a carrier and/or the build area discussed above. The same may apply to raw material powder layers which are deposited on said substrate.

To the contrary, in case of being provided as a work piece to be repaired, the substrate may assume a more complex three-dimensional form and comprise certain regions in which work piece layers need to be at least partially restored. The workpiece to be repaired may have been formed by solidifying raw material powder layers, e.g. by selective laser melting.

The method may further comprise the step of separating the produced work piece from the substrate and, optionally, re-using the substrate for the production of a further work piece. Separation from the substrate may be necessary to overcome the metallurgical bond. The separation may involve a step of cutting through a boundary or melting region between the work piece and the substrate. Additionally or alternatively, mechanical forces may be applied, e.g. for pulling the substrate and work piece apart. As only a thin substrate layer might have been melted to the work piece for producing the metallurgical bond, the substrate may be re-used for the production of further work piece. Said further work piece may be produced similarly to the above method steps.

The method may further comprise the step of pre-heating a deposited raw material powder layer prior to irradiating it for producing a work piece layer. This may relate to the first raw material powder layer or any of a possible sequence of further raw material powder layers being deposited and irradiated. Preheating may be achieved by a separate preheating device or by a radiation beam emitted by the same irradiation device used for actually irradiating (and melting) the raw material powder for producing a work piece layer. The preheating temperature of the raw material powder may be selected in dependence on the crystallization behavior of the raw material powder, in order to tailor the microstructure of a work piece made of said raw material powder by a additive layer construction method.

According to a further aspect, a uni-directional irradiation pattern is used. This may relate to any of the first or possible subsequent raw material powder layers being irradiated by a respective uni-directional irradiation pattern. As is well known, such a radiation pattern includes a movement of irradiation sites across an irradiation area only in one common direction (e.g. along commonly oriented scan or hatch vectors). In particular, the direction may be maintained for irradiating each of the deposited work piece layers. The inventor has discovered that this results in a unified direction of introducing heat into the material, which can be advantageous for producing single crystalline work pieces. Yet, it is also conceivable to, additionally or alternatively, use multi-direction irradiation patterns for at least some raw material powder layers, said patterns e.g. comprising oppositely oriented scan or hatch vectors.

Furthermore, the use of a (preferably single-crystalline) substrate as a substrate for depositing raw material powder thereon is proposed, said raw material powder layer being irradiated for producing or repairing a three-dimensional work piece according to an additive layering process, such as selective laser melting. Of course, the additive layering process may include depositing and irradiating single raw material powder layers as discussed above. The use may further include any of the above features, steps or aspects for providing any of the related effects or operating states. For example, the use may further include using a preferably single crystalline substrate for an additive layering process, such as selective laser melting, wherein a crystal orientation of the (preferably single-crystalline) substrate substantially corresponds to a build axis of the work piece to be produced or repaired.

Still further, an apparatus is proposed for producing or repairing a three-dimensional work piece, the apparatus comprising:
at least one substrate;
a powder application device adapted to depositing a first layer of a raw material powder onto the substrate; and
an irradiation device adapted to irradiating selected areas of the deposited raw material powder layer with an electromagnetic or particle radiation beam in a site selective manner in accordance with an irradiation pattern which corresponds to a geometry of a layer of the three-dimensional work piece to be produced, and
a control unit adapted to controlling the irradiation device so as to produce a metallurgical bond between the substrate and the raw material powder layer deposited thereon.

The apparatus may comprise any of the previously or subsequently discussed features, devices, units or other aspects. This relates in particular to any features, devices or units being necessary to achieve any of the previously or subsequently discussed effects or operating states or to perform any of the relevant method steps. In particular, the substrate may be a single-crystalline substrate.

For example, the apparatus may comprise a separating device for separating the substrate and work piece layers after completing production or repairing of the work piece.

In the following, preferred embodiments of the invention are explained in greater detail with reference to the accompanying schematic drawings, in which.

Figure 1:
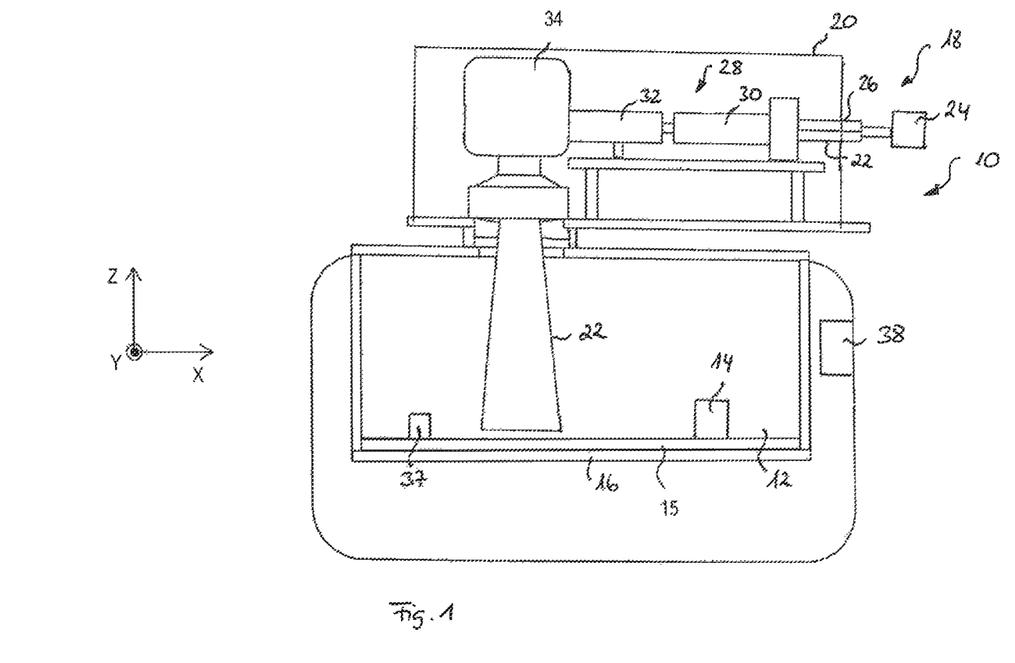
FIG. 1 shows an apparatus for producing three-dimensional work pieces.

FIG. 1 shows an apparatus 10 for producing three-dimensional work pieces by selective laser melting (SLM®). The apparatus 10 comprises a process chamber 12 which may be sealed against the ambient atmosphere such that an inert gas atmosphere, for example an Argon atmosphere, may be established within the process chamber 12. A powder application device 14 serves to apply a raw material powder by releasing it above a carrier 16. The carrier 16 is designed to be displaceable in vertical direction so that, with increasing construction height of a work piece, as it is built up in layers from the raw material powder on the carrier 16, the carrier 16 can be moved downwards in the vertical direction (in a negative Z-direction).

On top of the carrier, a single-crystalline substrate 15 is arranged which is movable along with the carrier 16. The powder application device 14 deposits a first raw material powder layer directly onto said substrate 15. Further raw material powder layers may then be subsequently deposited on top of said first raw material powder layer according to known additive layer manufacturing processes and especially according to known SLM processes. The workpiece to be produced may thus be build up in a positive direction along the vertical Z-axis of FIG. 1 which forms a build axis.

The substrate 15 is provided with a uniform crystal orientation which corresponds to the build axis, thus extending along the Z-axis. Other than that, the substrate 15 extends within the X-Y plane of FIG. 1 and completely covers a build area that can be used for generating workpiece layers.

The apparatus 10 further comprises an irradiation device 18 for selectively irradiating laser radiation onto the deposited raw material powder. By means of the irradiation device 18, the deposited raw material powder may be subjected to laser radiation in a site-selective manner in dependence on the desired geometry of the work piece that is to be produced. The irradiation device 18 has a hermetically sealable housing 20. A laser beam 22 provided by a laser source 24 which may, for example, comprise a diode pumped Ytterbium fibre laser emitting laser light at a wavelength of approximately 1070 to 1080 nm is directed into the housing 20 via an opening 26.

The irradiation device 18 further comprises an optical unit 28 for guiding and processing the laser beam 22, the optical unit 28 comprising optical elements such as a beam expander 30 for expanding the laser beam 22, a focusing lens 32 for focusing the laser beam 22 at a focus point and a scanner unit 34. The scanner unit 34 and the focus lens 32 are shown by way of example in the form of a galvanometer scanner and an f-theta object lens. By means of the scanner unit 34, the position of the laser beam 22 can be changed and adapted for moving said beam across a deposited raw material powder layer. For example, the irradiation device 18 may be an irradiation device as described in EP 2 335 848 A1.

In addition, the apparatus 10 comprises a heating device 37 for preheating the raw material powder prior to irradiating the laser beam 22 onto the raw material powder.

Figure 2:
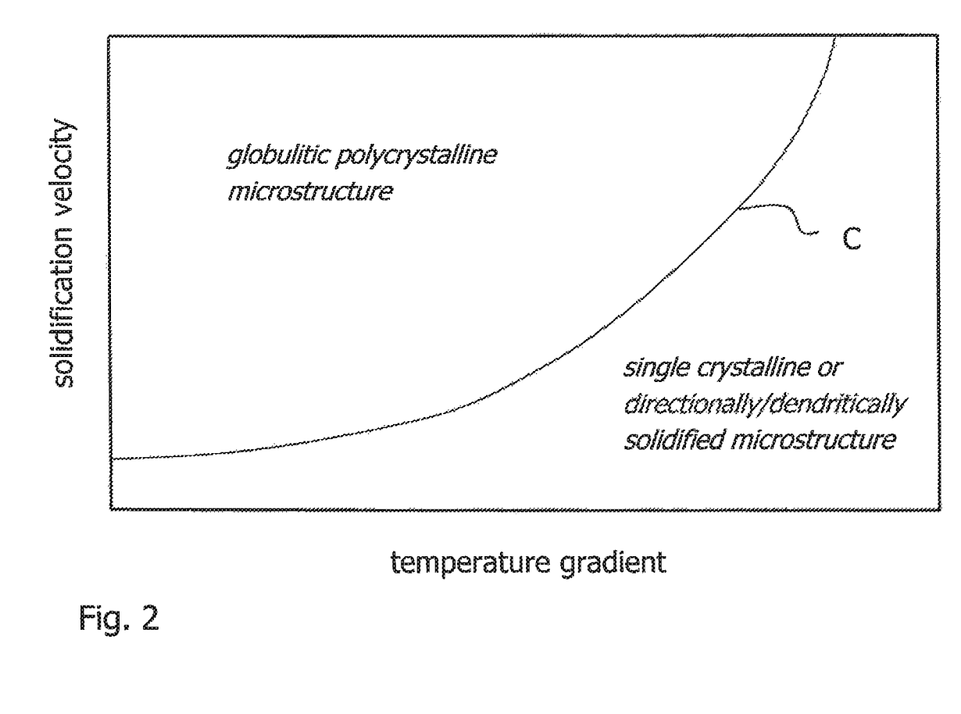
FIG. 2 shows, in schematic form, a v-G-diagram, wherein the solidification or crystal growth velocity v in a metallic melt is plotted against the temperature gradient G in the melt.

Finally, the apparatus 10 comprises a control unit 38 which is adapted to control the operation of the powder application device 14 and the irradiation device 18 in dependence on the crystallization behavior of the raw material powder, in order to tailor the microstructure of a work piece made of said raw material powder by a additive layer construction method. The crystallization behavior of a metallic melt, may be described a v-G-diagram, which, in schematic form, is illustrated in FIG. 2. In the v-G-diagram, a solidification or crystal growth velocity v is plotted against the temperature gradient G, typically on a double logarithmic scale. A v-G-diagram may be measured or calculated for any desired material, as it is well known in the art. In the schematic v-G-diagram of FIG. 2, a curve C separates an areal region of the diagram, wherein the combination of high solidification or crystal growth velocities and low temperature gradients lead to the development of a polycrystalline globulitic microstructure, from an areal region of the diagram, wherein the combination of low solidification or crystal growth velocities and (local) undercooling of the melt due to high temperature gradients result in the formation of dendrites and single crystals. With regard to the present embodiment, these temperature gradients particularly relate to temperature gradients in the negative Z-direction of FIG. 1.

The control unit 38 of the apparatus 10 thus is adapted to control the operation of the powder application device 14 and the irradiation device 18 in such a manner that, in dependence on the raw material powder type, a suitable combination of the solidification or crystal growth velocity and the temperature gradient occurring in the melt produced by irradiating the powder with the laser beam 22 is obtained in order to generate the desired microstructure, and in particular a directionally solidified microstructure comprising substantially dendrites and/or single crystals.

Specifically, the control unit 38 is adapted to control the laser source 24 and the optical unit 28 so as to adjust different operating parameters of the laser source 24 and the optical unit 28 in dependence on the crystallization behavior of the raw material powder, in order to tailor the microstructure of a work piece made of said raw material powder by an additive layer construction method. The operating parameters of the laser source 24 and the optical unit 28 which may be controlled by means of the control unit 38 include a beam size, in particular a beam diameter, of the laser beam 22 irradiated onto the raw material powder applied onto the carrier 16 and a beam profile of a laser beam 22 irradiated onto the raw material powder applied onto the carrier 16.

For example, the beam size of the laser beam 22 may be increased under the control of the control unit 38 in order to promote the occurrence of a low solidification or crystal growth velocity in combination with a high temperature gradient in the melt produced by irradiating the powder and to thus obtain a substantially single crystalline or directionally/dendritically solidified microstructure in the generated work piece. Additionally or alternatively thereto, it is conceivable to promote the occurrence of a low solidification or crystal growth velocity in combination with a high temperature gradient in the melt and thus the formation of a substantially single crystalline or directionally/dendritically solidified microstructure in the generated work piece by changing the beam profile of the laser beam 22.

Further, the operating parameters of the laser source 24 and/or the optical unit 28 which may be controlled by means of the control unit 38 include a moving speed of an irradiation site (presently corresponding to a scan speed) across the deposited raw material powder and/or a radiation or scan pattern of the laser beam 22. For example, the moving speed may be set under the control of the control unit 38 in order to promote the occurrence of a low solidification or crystal growth velocity in combination with a high temperature gradient in the melt produced by irradiating the powder and to thus obtain a substantially single crystalline or directionally/dendritically solidified microstructure in the generated work piece. For doing so, a moving speed between 50-500 mm/s may be chosen. Additionally or alternatively thereto, it is conceivable to promote the occurrence of a low solidification or crystal growth velocity in combination with a high temperature gradient in the melt and thus the formation of a substantially single crystalline or directionally/dendritically solidified microstructure in the generated work piece by setting the distance between hatches along which the laser beam 22 is guided over the powder surface. Said distance may be chosen to be less than a beam diameter of the laser beam 22 or, as a general example, may be less than 1 mm.

Finally, a laser power of the laser source 24 may be controlled by means of the control unit 38 in such a manner that, in dependence on the raw material powder type, a suitable combination of the solidification or crystal growth velocity and the temperature gradient occurring in the melt produced by irradiating the powder is obtained in order to generate the desired microstructure. Specifically, the laser power of the laser source 24 may be increased under the control of the control unit 38 in order to promote the occurrence of a low solidification or crystal growth velocity in combination with a high temperature gradient in the melt and thus the formation of a substantially single crystalline or directionally/dendritically solidified microstructure in the generated work piece.

The control unit 38 further is adapted to control the operation of the carrier 16 in connection with an operation of the powder application device 14 so as to adjust a thickness of a raw material powder layer applied onto the carrier 16 in dependence on the crystallization behavior of the raw material powder, in order to tailor the microstructure of a work piece made of said raw material powder by an additive layer construction method. For example, the operation of the carrier 16 may be controlled so as to move by a predetermined amount in the negative Z-direction, said amount corresponding to the thickness of the raw material powder layer being deposited by means of the powder application device 14. Specifically, the thickness of the raw material powder layer applied onto the carrier may be set to a value between 50-250 µm, if it is desired to promote the occurrence of a low solidification or crystal growth velocity in combination with a high temperature gradient in the melt and thus the formation of a substantially single crystalline or directionally/dendritically solidified microstructure in the generated work piece.

Moreover, the control unit is adapted to control the heating device 37 so as to adjust a preheating temperature of the raw material powder in dependence on the crystallization behavior of the raw material powder, in order to tailor the microstructure of a work piece made of said raw material powder by an additive layer construction method.

Finally, the control unit 38 is adapted to control any of the above discussed parameters such that a grain growth direction of the irradiated and thereby melted raw material powder layers corresponds to a crystal orientation of the substrate 15. In the present case, this means that the control unit 38 sets the above parameters such that a grain growth direction along the build axis is achieved.

In sum, the single-crystalline substrate 15 thus promotes a single-crystalline microstructure of the workpiece layers produced from the raw material powder deposited thereon. This single-crystalline microstructure and the associated grain growth is maintained when depositing and irradiating subsequent raw material powder layers by means of suitably setting the above-discussed parameters with the control unit 38.

For doing so, a very thin top surface layer of the single-crystalline substrate 15 is melted when irradiating a raw material powder layer being deposited first and directly onto the substrate 15. This way, a metallurgical bond forms between said surface layer of the single-crystalline substrate 15 and the melted powder material of the first layer. Due to the substrate 15 having a preferred crystal orientation, the microstructure of the melted powder material will also epitaxially grow along this orientation to produce and overall single-crystalline work piece. Overall, it is not mandatory that the substrate 15 has a respective single-crystalline microstructure. However, this may allow for a particularly efficient production of a single-crystalline microstructure within the produced workpiece layer.

EXAMPLE 1

A predominantly single-crystalline work piece having a height along the build axis Z of about 10 mm has been generated from the material IN738LC with the device of FIG. 1. This material has been used both for the substrate 15 as well as the raw material powder deposited thereon.

Alternatively, the substrate and powder material may have a different chemical composition form one another, wherein the substrate is preferably single-crystalline.

For producing work pieces based on this powder material and substrate, suitable ranges for the relevant process parameters have been identified. Specifically, the laser power has been set to 500-1000 W, the scan speed has been set to 50-500 mm/s, a hatch distance between adjacent scan vectors has been set to 100-500 μm and the layer thickness of the deposited raw material powder has been set to 50-250 μm.

Furthermore, these parameters have been set so that a remelting rate Rz along the build axis Z fulfils the following condition: Rz>0.3 and a remelting rate within the plane of a presently irradiated raw material powder layer Rx fulfils the following condition: Rx>0.3. Said remelting rates are determined as discussed above. Moreover, it has been found that good results are still achieved when only setting one of the remelting rates in this manner.

Overall, according to this example, a single-crystalline work piece has been produced with an improved quality and a higher reliability while using the (preferably single-crystalline) substrate 15.

The invention claimed is:

1. A method for producing or repairing a three-dimensional metallic work piece having a substantially single crystalline microstructure, the method comprising the following steps:
   providing at least one substantially single-crystalline substrate;
   depositing a first layer of a metallic raw material powder onto the substrate; and
   irradiating selected areas of the deposited raw material powder layer with an electromagnetic or particle radiation beam in a site selective manner in accordance with an irradiation pattern which corresponds to a geometry of at least part of a layer of the three-dimensional work piece to be produced,
   wherein
   the irradiation is controlled so as to produce a metallurgical bond between the substrate and the raw material powder layer deposited thereon, and the irradiation is controlled so that the following applies:
   a remelting rate of a remelting within a plane of a presently irradiated raw material powder layer Rx fulfils the following condition: Rx>0.3, with Rx=((W−dy)/W), W being a melt pool width and dy being a distance between adjacent irradiation sites of the raw material powder layer, wherein the distance dy is defined by adjacent scan vectors along which respective irradiation sites are arranged, and wherein the remelting results from radiation beam diameters of the radiation beam overlapping each other when being moved along the adjacent scan vectors.

2. The method according to claim 1, wherein after completing irradiation of the first raw material powder layer, multiple sequences of depositing and irradiating subsequent raw material powder layers are performed, to successively build up the work piece along a build axis.

3. The method according to claim 1, wherein a remelting rate along the build axis Rz fulfils the following condition: Rz>0.3, with Rz=((D−lz)/D), lz being the layer thickness of the presently irradiated raw material powder layer and D being a melt pool depth occurring as a result of the irradiation.

4. The method according to claim 3, further comprising the step of:
   adjusting the crystal orientation of the single-crystalline substrate so as to correspond to the build axis.

5. The method according to claim 1, further comprising the step of:
   adjusting a crystal orientation of the single-crystalline substrate and a grain growth direction in the layer of the three-dimensional work piece occurring upon irradiating said layer so as to correspond to one another.

6. The method according to claim 1, wherein at least one of the following parameters is used for controlling the irradiation:
   a beam size, a defocusing state and/or a beam profile of the electromagnetic or particle radiation beam,
   an exposure time of the selected areas of a deposited raw material powder to the electromagnetic or particle radiation beam,
   the irradiation pattern,
   a speed of moving an irradiation site across a deposited raw material powder layer, and
   an energy input of the electromagnetic or particle radiation beam into the selected areas of the raw material powder layer applied onto the substrate.

7. The method according to claim 6, wherein the at least one parameter is constant between at least some of the subsequent raw material powder layers.

8. The method according to claim 1, wherein the irradiation is controlled in dependence on the crystallization behavior of the raw material powder in such a manner that single-crystalline layers of the three-dimensional work piece are produced.

9. The method according to claim 1, wherein the substrate fulfils at least one of the following conditions:
   the substrate covers at least 0.1%, at least 10%, at least 25%, at least 50%, at least 75% or 100% of a build area that is available for depositing raw material powder layer thereon in order to produce the work piece;
   the substrate is configured as a substantially planar member and, for example, defines a rectangular plane;
   a thickness of the substrate along the build axis is not more than 1000 mm, not more than 200 mm, not more than 100 mm, not more than 50 mm or not more than 10 mm,
   the substrate is a single crystal work piece which, for example, needs to be repaired.

10. The method according to claim 1, further comprising the step of separating the produced work piece from the substrate and, optionally, re-using the substrate for the production of a further work piece.

11. The method according to claim 1, further comprising the step of pre-heating a deposited raw material powder layer prior to irradiating it for producing a work piece layer.

12. The method according to claim 1, wherein a uni-directional irradiation pattern or a multi-directional irradiation pattern is used.

13. Apparatus for producing or repairing a three-dimensional metallic work piece having a substantially single crystalline microstructure, the apparatus comprising:
   at least one substantially single-crystalline substrate;
   a powder application device adapted to depositing a first layer of a metallic raw material powder onto the substrate; and
   an irradiation device adapted to irradiating selected areas of the deposited raw material powder layer with an electromagnetic or particle radiation beam in a site selective manner in accordance with an irradiation pattern which corresponds to a geometry of a layer of the three-dimensional work piece to be produced, and
   a control unit adapted to controlling the irradiation device so as to produce a metallurgical bond between the substrate and the raw material powder layer deposited thereon, and the control unit controlling the irradiation device so that the following applies:
   a remelting rate of a remelting within a plane of a presently irradiated raw material powder layer Rx fulfils the following condition: Rx>0.3, with Rx=((W− dy)/W), W being a melt pool width and dy being a distance between adjacent irradiation sites of the raw material powder layer, wherein the distance dy is defined by adjacent scan vectors along which respective irradiation sites are arranged, wherein the remelting results from radiation beam diameters of the radiation beam overlapping each other when being moved along the adjacent scan vectors.

14. Apparatus according to claim 13, wherein a remelting rate along the build axis Rz fulfils the following condition: $Rz>0.3$ with $Rz=((D-lz)/D)$, lz being the layer thickness of the presently irradiated raw material powder layer and D being a melt pool depth occurring as a result of the irradiation.

* * * * *